(12) United States Patent
Samaan (10) Patent No.: US 6,535,013 B2
(45) Date of Patent: Mar. 18, 2003

(54) PARAMETER VARIATION PROBING TECHNIQUE

(75) Inventor: Samie B. Samaan, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 09/749,433

(22) Filed: Dec. 28, 2000

(65) Prior Publication Data

US 2002/0084797 A1 Jul. 4, 2002

(51) Int. Cl.[7] ............................................. G01R 31/26
(52) U.S. Cl. ..................... 324/765; 324/763; 324/158.1
(58) Field of Search ................................ 324/765, 763, 324/755; 439/66–70; 368/101–123; 714/733, 734; 257/48; 331/65, 57

(56) References Cited

U.S. PATENT DOCUMENTS

| | | | | | |
|---|---|---|---|---|---|
| 4,799,259 | A | * | 1/1989 | Ogrodski | 331/78 |
| 5,811,985 | A | * | 9/1998 | Trimberger et al. | 326/38 |
| 5,999,009 | A | * | 12/1999 | Mitsui | 324/763 |
| 6,177,845 | B1 | * | 1/2001 | Moll | 327/141 |
| 6,239,603 | B1 | * | 5/2001 | Ukei et al. | 324/763 |

OTHER PUBLICATIONS

U.S. patent application Ser. No. 09/606,484, Stinson et al., filed Jun. 29, 2000.

* cited by examiner

Primary Examiner—Kamand Cuneo
Assistant Examiner—Tung X. Nguyen
(74) Attorney, Agent, or Firm—Antonelli, Terry, Stout & Kraus, LLP (57) ABSTRACT

A technique for probing parameter variations in an integrated circuit chip includes providing a group of ring oscillators disposed over the integrated circuit chip, each oscillator producing an output representative of an integrated circuit chip parameter or group of parameter. A controller is provided to selectively enable one of the group of ring oscillators and a multiplexer is provided to output an output of one of the group of ring oscillators enabled by the controller. Each ring oscillator may include a gated inverter, having an enable/disable input, connected to a group of inverters arranged in a ring, the total number of inverters being an odd number. The group of ring oscillators may include a shift register chain consisting of a group of shift registers, an output of each shift register being respectively connected to an enable/disable input of the gated inverter of one of the group of ring oscillators. The multiplexer may include an exclusive-OR gate having inputs respectively connected to an output of each of the group of ring oscillators. An inverter may be disposed between each output of the group of ring oscillators and its' respective input to the multiplexer.

31 Claims, 6 Drawing Sheets

PARAMETER VARIATION PROBING TECHNIQUE

FIELD OF THE INVENTION

The present invention relates to a parameter variation probing technique and more particularly, to a technique for probing parameter variations in an integrated circuit chip

BACKGROUND OF THE INVENTION

There are inherent parameter variations in integrated circuit chips, such as VLSI (Very Large Scale Integration) chips. As the system clock frequencies of such chips increase, the cycle times decrease. Fluctuations in gate delays due to intra-die parameter variations, interconnect loading variations, interconnect coupling variations, temperature fluctuations, and local supply voltage variations are becoming more and more significant as the cycle times decrease. Furthermore, as the elements sizes and interconnect line widths decrease, these variations increase. In order to prevent functional race conditions and to improve the speed of the integrated circuit chip elements, these variations have been compensated for by providing an additional design margin in the timing calculations. As the speeds of the integrated circuit chips increase, this additional design margin becomes an ever increasing percentage of the cycle time of the chips, thereby severely limiting the design space available to a designer, resulting in longer design cycles and lower product target frequencies.

Furthermore, gate delay variations due to intra-die device parameter variations, such as channel length and threshold voltage in MOSFET circuit elements, are presumed to account for roughly 25% of the minimum-delay (hold) margin required in a design and more than 15% of that required for maximum-delay (setup). The amount of gate delay variations of MOSFET gate elements has been estimated from knowledge of the VLSI fabrication process device parameter variation specifications. However, due to probing difficulties, few direct measurements have been made to validate the accuracy of these presumptions It would therefore be desirable to have an easily obtainable, objective, the historical accumulation of chip element and interconnect parameter variations across a chip for progressive process generations. Such historical perspective would allow for better strategic engineering predictions regarding the feasibility of current design technologies using future advanced process technologies. Device parameter variations on these advanced process technologies will likely get worse as feature sizes shrink and accordingly, it would be desirable to have an objective measurement technique to replace the educated guesses that have been employed up until this time. Such a technique would improve design space, reduce design time, and enhance target speed performance.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same as by way of illustration and example only and the invention is not limited thereto. The spirit and scope of the present invention of limited only by the terms of the appended claims.

The following represents brief descriptions of the drawings, wherein.

DETAILED DESCRIPTION

Before beginning a detailed description of the subject invention, mention of the following is in order. When appropriate, like reference numerals and characters may be used to designate identical, corresponding, or similar components in differing drawing figures. Furthermore, in the detailed description to follow, example sizes/models/values/ranges may be given, although the present invention is not limited thereto. Still furthermore, clock signals and timing signals are not drawn to scale and instead, exemplary and critical time values are mentioned when appropriate. With regard to description of any timing signals, the terms assertion and negation may be used in an intended generic sense. More particularly, such terms may be used to avoid confusion when working with a mixture of "active-low" and "active-high" signals, and tour present the fact that the invention is not limited to the illustrated/described signals, but could be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. As a final note, power connections and other well-known components may not be shown within the drawing figures for simplicity of illustration and discussion and so as not to obscure the invention.

In the present invention, ring oscillators consisting of an odd number of inverters arranged in a closed loop, are disposed opportunistically over an integrated circuit chip, depending on available layout space. Each ring oscillator oscillates at a frequency which is a function of the average device parameter values at its location. By allowing only one oscillator to operate at any one time, and to record its oscillation frequency, it is possible to map the device speed variations over the integrated circuit chip. Control of the oscillators may be effected via a serial string of registers forming a TAP (Test Access Port) chain.

A small group of ring oscillators may be disposed within a small Functional Unit Block (hereinafter referred to as a FUB-let). Each FUB-let may include a series of frequency countdown circuits, if needed, to lower the ring oscillator frequencies from a GHz range, for example, down to a 100 MHz range, for example. A few larger FUBs containing additional ring oscillators may also be disposed over the integrated circuit chip to probe short range or purely random speed variations.

Furthermore, rather than only outputting the divided down oscillations of the ring oscillators to an analog output pin of the integrated circuit chip, an onchip frequency counter may be employed. The counter's timing gate pulse may be provided externally by a functional tester which is normally used to test integrated circuit packaged chips. The frequency counter of the counter may then be downloaded to the tester using the TAP, for example. The counter's timing gate pulse may also be provided internally by the TAP, for example.

Figure 1:
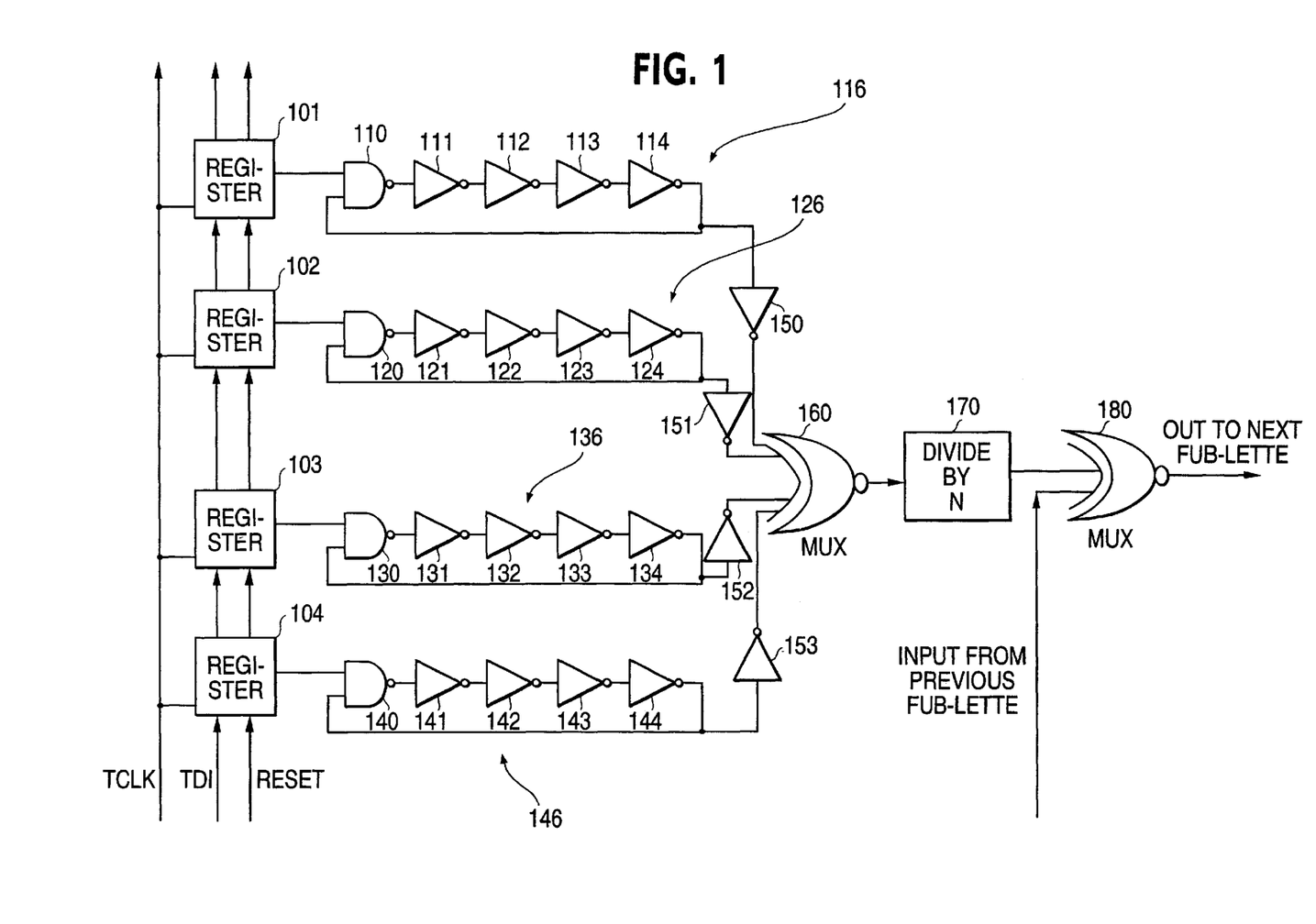
FIG. 1 is a block diagram illustrating an example of a Functional Unit Block (FUB).

FIG. 1 illustrates an example of an FUB. The illustrated example includes ring oscillators, a countdown unit, and an output frequency multiplexing circuit. As illustrated therein, four sets of ring oscillators, 116, 126, 136, and 146, each respectively include inverters 111–114, 121–124, 131–134 and 141–144 and further respectively include NAND gates 110, 120, 130, and 140. While each of the ring oscillators is illustrated as having five inversion producing elements, it is of course understood that any odd number of inversion producing elements may be used, the number depending upon the design of the inversion producing elements and the desired oscillation frequency of the resultant ring oscillator.

One input of each of the NAND gates 110, 120, 130, and 140 is respectively connected to outputs of registers 101, 102, 103, and 104 forming the TAP register chain. This allows the registers 101–104 to respectively enable/disable ring oscillators 116, 126, 136, and 146. The registers 101–104 are illustrated as being clocked by the clock signal TCLK and reset by the Reset signal and have a data input TDI. To enable one and only one of the ring oscillators, a string of logic 0's and only one logic 1 are scanned into the TAP register chain. For example, if the output of register 102 is a logic 1 and the outputs of registers 101, 103, and 104 are logic 0's, then the NAND gate 120 is enabled while the NAND gates 110, 130, and 140 are disabled, thereby enabling ring oscillator 126 and disabling ring oscillators 116, 136, and 146. It is of course understood that various other arrangements other than the TAP register chain may be used to enable/disable the ring oscillators.

The outputs of ring oscillators 116, 126, 136, and 146 are respectively connected via inverters 150–153 to a multiplexer 160. The inverters 150–153 are needed for buffering. Furthermore, if the oscillation frequency of the ring oscillators is higher than desired for further processing, frequency divider elements, for example, divide by two circuits, may be respectively disposed between the ring oscillators and the multiplexer. The multiplexer 160 is illustrated as an exclusive-OR element for illustrative purposes and may in fact be any suitable multiplexer element. Since only one of the ring oscillators is enabled and the remaining oscillators disabled, the output of the multiplexer 160 corresponds to the output of the enabled ring oscillator.

The output of the multiplexer 160 is illustrated as being inputted to a divide by N frequency divider 170 to lower the frequency of the enabled ring oscillator output. The frequency divider 170 is optional and may or may not be needed, depending on the oscillation frequency of the ring oscillators. The output of the frequency divider is inputted to another multiplexer 180 along with an input from another previous FUB-let and the output of the multiplexer 180 is outputted to a 0 multiplexer (not shown) of still another next FUB-let. As with the multiplexer 160, the multiplexer 180 has been shown as an exclusive-OR element for illustrative purposes and may in fact be any suitable multiplexer element.

The outputting of the output of the multiplexer of one FUB-let or FUB to a multiplexer of another FUB-let or FUB allows a single wire, strung along all of the FUB-lets and FUBs, to convey the output from any enabled ring oscillator of any FUB-let or FUB.

A larger FUB (not shown), containing a larger number of ring oscillators of varying sizes and perhaps of different numbers of inversions, may be disposed at various locations on the integrated circuit chip to study local, short-range, variations in the chip and random interconnect parameter variations. Such larger FUBs would be connected in the same fashion as The FUB-let of FIG. 1.

Figure 4:
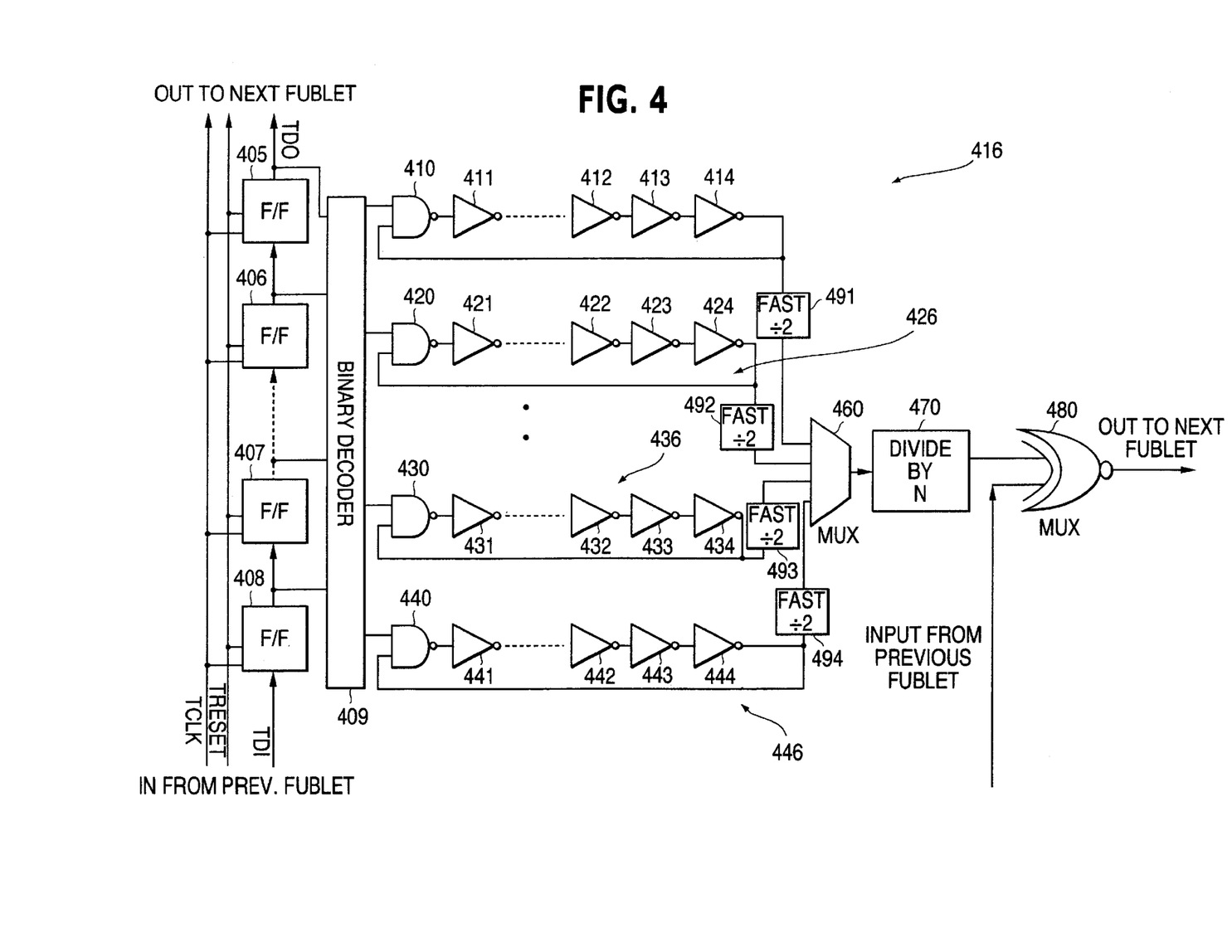
FIG. 4 is a block diagram illustrating another example of an FUB.

FIG. 4 illustrates another example of an FUB. In the drawing figure, element 410 corresponds to element 110 of FIG. 1, element 411 corresponds to element 111 of FIG. 1, etc.

FIG. 4 differs from FIG. 1 in that the registers 101, 102, 103, and 104 have been replaced by flip-flops 405, 406, 407, and 408 feeding a binary decoder 409. By this substitution, the scan-in chain gets a binary address which is then decoded using the binary decoder 409. This saves space since one can scan in a 4-bit binary address and then decode it locally to activate 15 or fewer oscillators. Address 0 selects nothing, thereby allowing all of the oscillators to be turned off upon reset.

FIG. 4 further differs from FIG. 1 in that while each oscillator in FIG. 1 is shown as having five inversions, the oscillators of FIG. 4 are shown as having five or more inversions. Furthermore, the Mux 460 is shown generically rather than being shown as the X-OR 160 of FIG. 1 since the element may be implemented by an AND tree, for example.

Lastly, FIG. 4 further differs from FIG. 1 in that fast divide by 2 elements 491, 492, 493, and 494 have been added between the oscillators and the first multiplexer 460. In practical implementations, it has been found that in view of the very high oscillation frequency of the oscillators, it is often necessary to divide their frequencies in half prior to inputting their outputs to the first multiplexer 460 so as to insure that the multiplexer 460 and subsequent circuitry operate properly.

Figure 2:
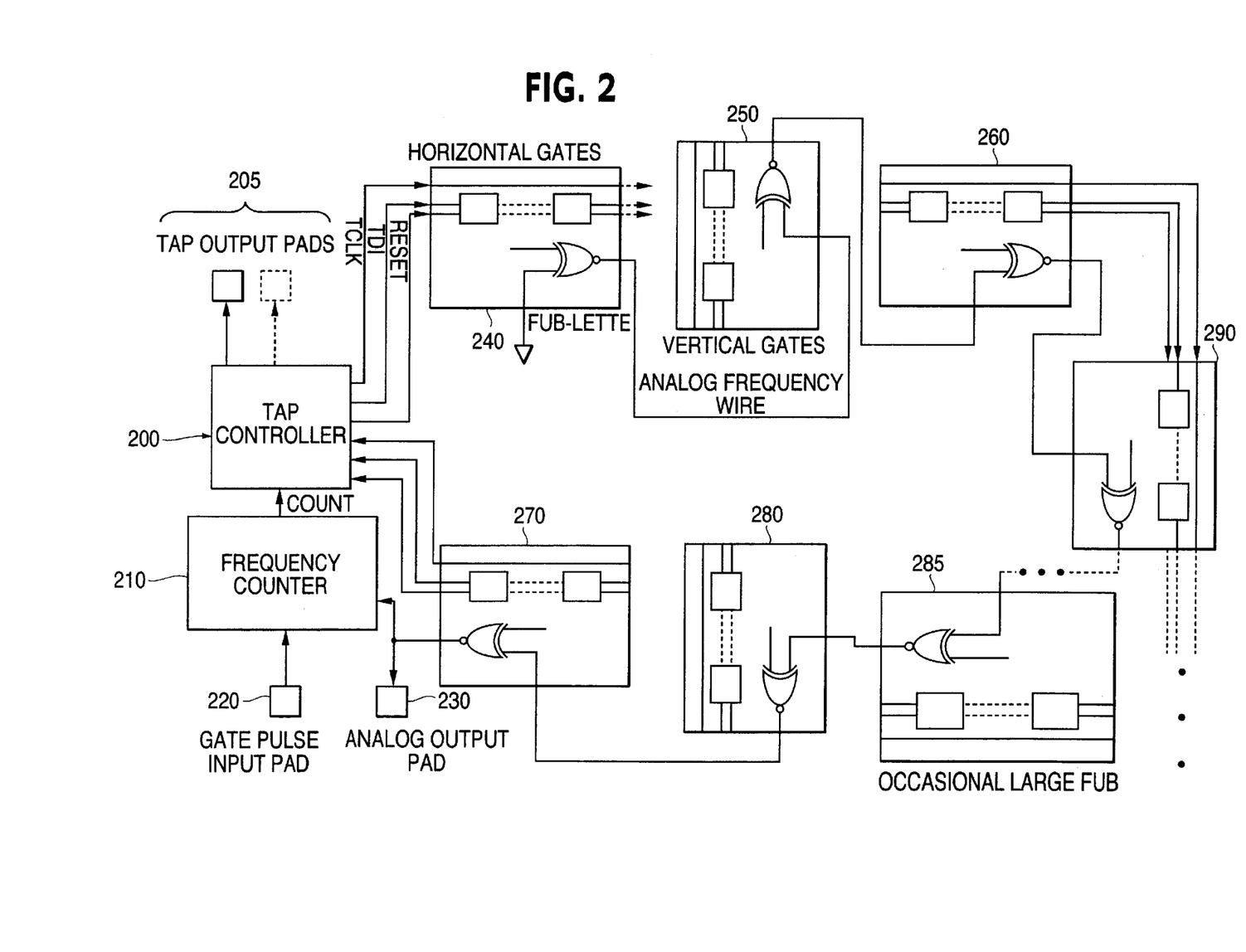
FIG. 2 is a block diagram illustrating an example of a group of FUB-lets and FUBs disposed on a chip.

FIG. 2 is a block diagram illustrating an example of a group of FUI-lets and FUBs disposed on an integrated circuit chip. As shown in FIG. 2, FUB-lets 240, 250, 260, 270, 280, and 290 are arranged in a chain along with FUB 285. FUB-let 240 is illustrated as having its ring oscillator gates all pointing in the horizontal (x-direction) of the integrated circuit chip while FUB-let 250 is illustrated as having its ring oscillator gates all pointing in the vertical (y-direction). These directions are merely for exemplary purposes to illustrate the possibility of orienting the ring oscillator gates to probe intra-die variations.

Note that all of the FUB-lets and FUBs are connected together in a daisy chain with only four interconnecting wires, namely, the TAP clock TCLK, a TAP Data Out (TDO), a Reset line, and an analog frequency wire which carries the ring oscillator outputs. The TAP controller 200 outputs these signals to the FUB-lets and FUBs as well as outputting various signals to the TAP output pads 205. The analog frequency wire may be connected to both an Analog Output Pad 230 and to a frequency counter 210. As illustrated and FIG. 2, a Gate Pulse Input Pad 220 is connected to the frequency counter 210 so as to allow an externally supplied gating pulse to be supplied to the frequency counter 210. It is of course understood that the gating pulse may be internally generated on the integrated circuit chip. Furthermore, the Analog Output Pad 230 may be eliminated or alternatively, the frequency counter 210 may be eliminated and the ring oscillator output frequencies measured externally.

Figure 5:
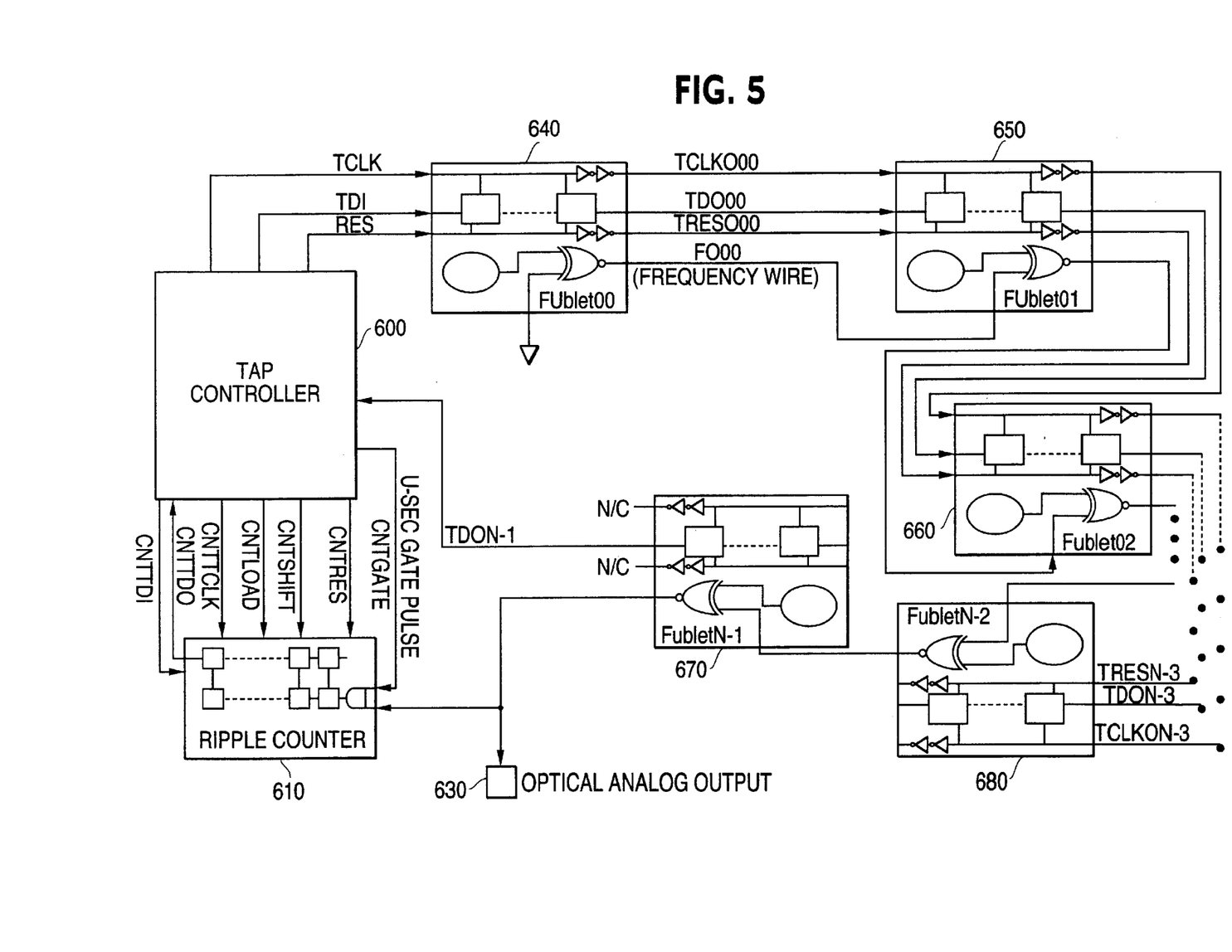
FIG. 5 is a block diagram illustrating another example of a group of FUB-lets and FUBs disposed on a chip.

FIG. 5 is a block diagram lowest rating another example of a group of FUB-lets and FUBs disposed on an integrated circuit chip. The significant difference between this drawing figure and FIG. 2 is that it is been found that is possible to include both horizontal and vertical gate orientations in the same FUB or FUB-let and accordingly, the FUBs and FUB-lets do not have to be rotated occasionally when being disposed around the integrated circuit chip.

Figure 3:
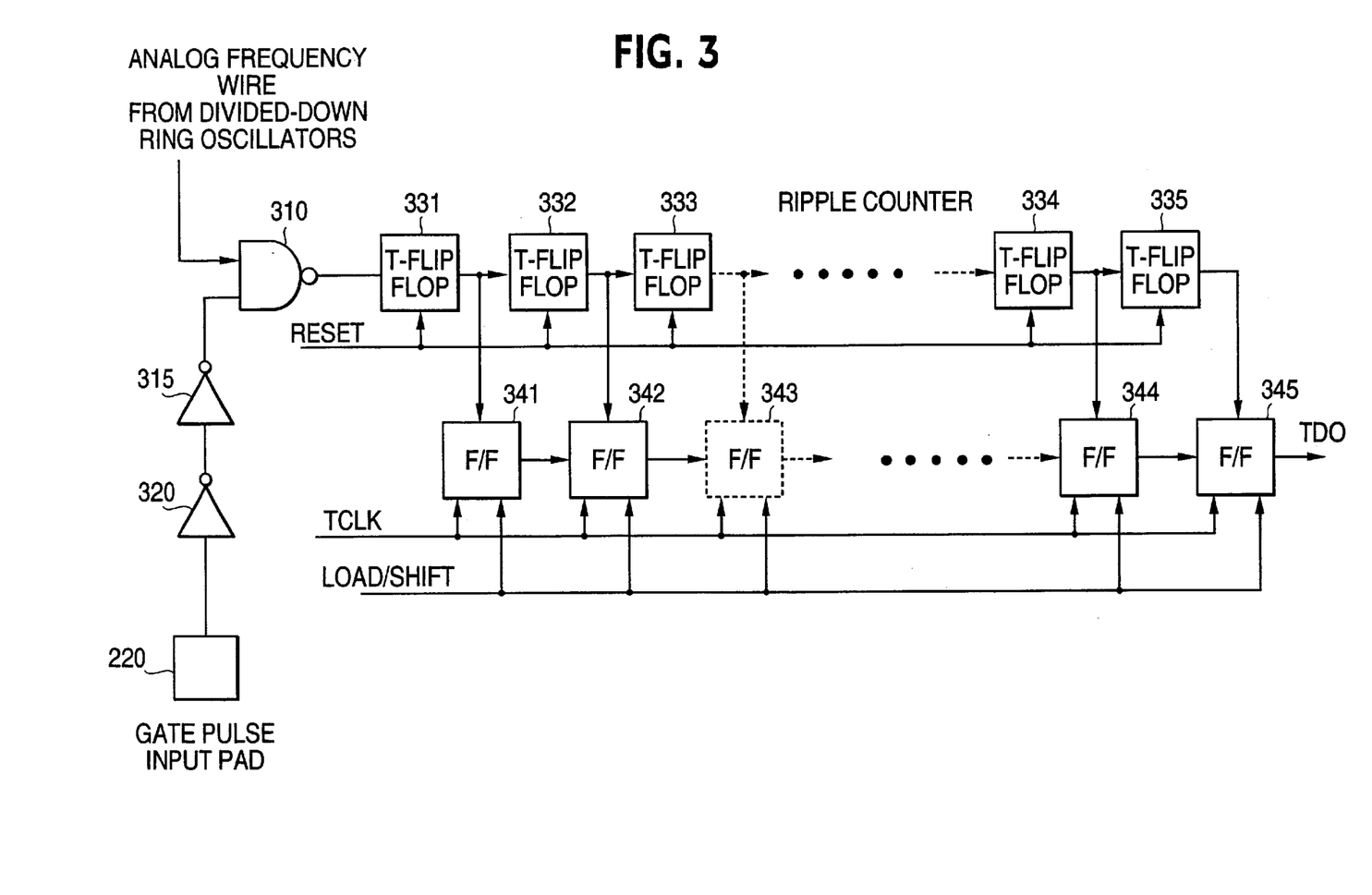
FIG. 3 is a block diagram illustrating an example of a ripple counter and scan-out chain.

FIG. 3 illustrates an example of a ripple counter connected to a scan-out chain. The analog frequency wire from the ring oscillators is inputted to one input of NAND gate 310 while the other input of the NAND gate 310 receives a gating input pulse via the Gate Pulse Input Pad 220 and inverters 315 and 320. As noted previously. The gating pulse may be internally generated on the integrated circuit chip rather than being externally inputted. The output of the NAND gate 310 is inputted to a ripple counter consisting of flip-flops 331–335. The number of stages of the ripple counter is of course determined by the frequency of the ring oscillator outputs and the number of frequency divisions that the outputs have undergone and the desired counter resolution. In operation, the gating pulse allows an output of one of the ring oscillators to be passed through the NAND gate 310 so as to be counted for a predetermined period of time. The count in The ripple counter would, therefore, be proportional to the frequency of the enabled ring oscillator. After the count in the ripple counter is acquired, it may be loaded into a scan-out chain consisting of flip-flops 341–345 and outputted serially on The TDO line under the control of die TAP controller 200. The use of the serial scan-out chain is merely for exemplary purposes and other techniques may be used to output the count acquired by the ripple counter.

Figure 6:
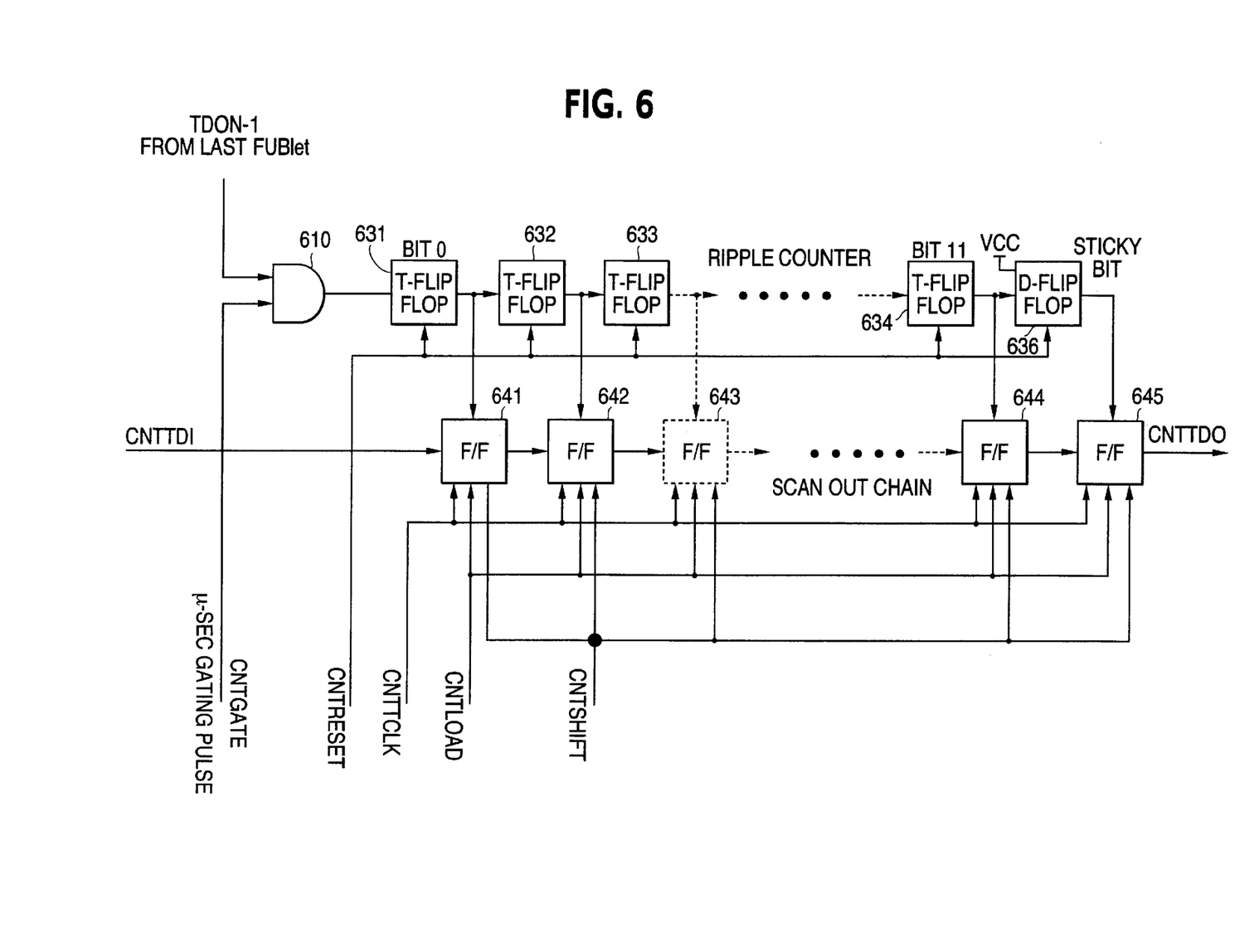
FIG. 6 is a block diagram illustrating another example of a ripple counter and scan-out chain.

FIG. 6 illustrates another example of a ripple counter connected to a scan-out chain. This drawing figure differs from FIG. 3 in that a sticky bit flip-flop 636 has been added. This bit indicates when the count has exceeded 12 bits for instance, thus requiring a reduction of the gating pulse width. It also shows the shift and load control signals from the TAP. The CNTRESET signal arrives first and recess the ripple counter. The CNTGATE pulse then arrives, opening the AND gate 610, thereby allowing the ripple counter to count. After the CNTGATE pulse ends, the TAP outputs a CNTLOAD signal to load the contents of the ripple counter to the scan out chain 641, 642, 643, 644, and 645. A CNTSHIFT signal that arrives and along with the signal CNTTCLK, shifts the reading out to the TAP which then sends it to the chip's output pads.

Thus, in accordance with the present invention, by utilizing a plurality of FUB-lets and FUBs disposed at various locations over the integrated circuit chip and selectively enabled to produce signals proportional to parameters of the integrated circuit chip, it is possible to quickly and easily and economically probe parameter variations in an integrated circuit chip.

This concludes the description of the example embodiments. Although the present invention has been described with reference to a number of illustrative embodiments thereof, it should be understood that numerous other modifications and embodiments can be devised by those skilled in the art that will fall within the spirit scope of the principles of this invention. More particularly, reasonable variations and modifications are possible in the component parts and/or arrangements of the subject combination arrangement within the scope of the foregoing disclosure, the drawings, and the appended claims without departing from the spirit of the invention. In addition to variations and modifications in the component parts and/or arrangements, alternative uses will also be apparent to those skilled in the art.

What is claimed is:

1. An apparatus for probing parameter variations in an integrated circuit chip comprising:
   a plurality of ring oscillators disposed over the integrated circuit chip, each oscillator, when enabled, producing an output representative of an integrated circuit chip parameter or group of parameters;
   a controller connected to the plurality of ring oscillators to selectively enable one of the plurality of ring oscillators;
   at least one daisy-chain output line having a path thereof disposed over the integrated circuit chip; and
   a plurality of gating-devices to connect ones of the plurality of ring oscillators to the at least one daisy-chain output line at differing locations along the path thereof to daisy-chain the outputs from the plurality of ring oscillators, to provide an output thereof on the at least one daisy-chain output line.

2. The apparatus of claim 1, wherein each ring oscillator comprises a gated inverter having an enable/disable input and a plurality of inverters, the gated inverter and the plurality of inverters being arranged in a ring, the total number of inverters, including the gated inverter, being an odd number.

3. An apparatus for probing parameter variations in an integrated circuit chip comprising:
   a plurality of ring oscillators disposed over the integrated circuit chip, each oscillator, when enabled, producing an output representative of an integrated circuit chip parameter or group of parameters;
   a controller connected to the plurality of ring oscillators to selectively enable one of the plurality of ring oscillators; and
   a multiplexer connected to the plurality of ring oscillators to provide an output thereof;
   wherein each ring oscillator comprises a gated inverter having an enable/disable input and a plurality of inverters, the gated inverter and the plurality of inverters being arranged in a ring, the total number of inverters, including the gated inverter, being an odd number; and
   wherein the plurality of ring oscillators comprise a shift register chain comprised of a plurality of shift registers, an output of each shift register being respectively connected to an enable/disable input of the gated inverter of one of the plurality of ring oscillators.

4. The apparatus of claim 1, wherein ones of the plurality of gating-devices comprise an exclusive-OR gate having inputs respectively connected to an output of ones of the plurality of ring oscillators.

5. The apparatus of claim 4, further comprising an inverter disposed between each output of the plurality of ring oscillators and its' respective input to a gating-device of the plurality of gating-devices.

6. The apparatus of claim 1, further comprising a frequency counter connected to an output of the at least one daisy-chain output line.

7. An apparatus for probing parameter variations in an integrated circuit chip comprising:
   a plurality of ring oscillators disposed over the integrated circuit chip, each oscillator, when enabled, producing an output representative of an integrated circuit chip parameter or group of parameters;
   a controller connected to the plurality of ring oscillators to selectively enable one of the plurality of ring oscillators; and a multiplexer connected to the plurality of ring oscillators to provide an output thereof; and a frequency counter connected to an output of the multiplexer, wherein the frequency counter comprises an input gate connected to a ripple counter, the input gate receiving the output of the multiplexer and also receiving a gate pulse of the predetermined width such that the output of the multiplexer is selectively inputted to the ripple counter by the gate pulse to enable the ripple counter to count to a number which is proportional to the frequency of the selectively enabled ring oscillator.

8. The apparatus of claim 7, further comprising a scan-out chain comprising flip-flops respectively connected to the ripple counter to output the number counted by the ripple counter.

9. A method of probing parameter variations in an integrated circuit chip comprising:

having a plurality of ring oscillators disposed over the integrated circuit chip, each oscillator, when enabled, producing an output representative of an integrated circuit chip parameter or group of parameters;

selectively enabling one of the plurality of ring oscillators;

having at least one daisy-chain output line having a path thereof disposed over the integrated circuit chip; and having a plurality of gating-devices connect ones of the plurality of ring oscillators to the at least one daisy-chain output line at differing locations along the path thereof to daisy-chain the outputs from the plurality of ring oscillators, to provide an output thereof on the at least one daisy-chain output line.

10. A method of probing parameter variations in an integrated circuit chip comprising:

having a plurality of ring oscillators disposed over the integrated circuit chip, each oscillator, when enabled, producing an output representative of an integrated circuit chip parameter or group of parameters;

selectively enabling one of the plurality of ring oscillators;

multiplexing outputs of the plurality of ring oscillators for providing an output thereof; and measuring a frequency of the multiplexed output to produce a measured frequency of an enabled ring oscillator, the measured frequency being representative of an integrated circuit chip parameter or group of parameters at a location of the enabled ring oscillator.

11. The method of claim 10, further comprising outputting the measured frequency as a digital output.

12. The method of claim 10, further comprising outputting the measured frequency as a serial digital output.

13. An integrated circuit chip comprising an apparatus for probing parameter variations, the apparatus comprising:

a plurality of ring oscillators disposed over the integrated circuit chip, each oscillator, when enabled, producing an output representative of an integrated circuit chip parameter or group of parameters;

a controller connected to the plurality of ring oscillators to selectively enable one of the plurality of ring oscillators;

at least one daisy-chain output line having a path thereof disposed over the integrated circuit chip; and a plurality of gating-devices to connect ones of the plurality of ring oscillators to the at least one daisy-chain output line at differing locations along the path thereof to daisy-chain the outputs from the plurality of ring oscillators, to provide an output thereof on the at least one daisy-chain output line.

14. The integrated circuit chip of claim 13, wherein each ring oscillator comprises a gated inverter having an enable/disable input and a plurality of inverters, the gated inverter and the plurality of inverters being arranged in a ring, the total number of inverters, including the gated inverter, being an odd number.

15. An integrated circuit chip comprising an apparatus for probing parameter variations, the apparatus comprising:

a plurality of ring oscillators disposed over the integrated circuit chip, each oscillator, when enabled, producing an output representative of an integrated circuit chip parameter or group of parameters;

a controller connected to the plurality of ring oscillators to selectively enable one of the plurality of ring oscillators; and a multiplexer connected to the plurality of ring oscillators to provide an output thereof;

wherein each ring oscillator comprises a gated inverter having an enable/disable input and a plurality of inverters, the gated inverter and the plurality of inverters being arranged in a ring, the total number of inverters, including the gated inverter, being an odd number; and wherein the plurality of ring oscillators comprise a shift register chain comprised of a plurality of shift registers, an output of each shift register being respectively connected to an enable/disable input of the gated inverter of one of the plurality of ring oscillators.

16. The integrated circuit chip of claim 13, wherein ones of the plurality of gating-devices comprise an exclusive-OR gate having inputs respectively connected to an output of ones of the plurality of ring oscillators.

17. The integrated circuit chip of claim 16, further comprising an inverter disposed between each output of the plurality of ring oscillators and its' respective input to a gating-device of the plurality of gating-devices.

18. The integrated circuit chip of claim 13, further comprising a frequency counter connected to an output of the at least one daisy-chain output line.

19. An integrated circuit chip comprising an apparatus for probing parameter variations, the apparatus comprising:

a plurality of ring oscillators disposed over the integrated circuit chip, each oscillator producing an output representative of an integrated circuit chip parameter;

a controller connected to the plurality of ring oscillators to selectively enable one of the plurality of ring oscillators;

a multiplexer connected to the plurality of ring oscillators to provide an output thereof; and a frequency counter connected to an output of the multiplexer, wherein the frequency counter comprises an input gate connected to a ripple counter, the input gate receiving the output of the multiplexer and also receiving a gate pulse of the predetermined width such that the output of the multiplexer is selectively inputted to the ripple counter by the gate pulse to enable the ripple counter to count to a number which is proportional to the frequency of the selectively enabled ring oscillator.

20. The apparatus of claim 2, wherein the plurality of ring oscillators comprise a shift register chain comprised of a plurality of shift registers, an output of each shift register being respectively connected to an enable/disable input of the gated inverter of one of the plurality of ring oscillators.

21. The apparatus of claim 6, further comprising a scan-out chain comprising flip-flops respectively connected to the frequency counter to output the number counted by the frequency counter.

22. The apparatus of claim 3, wherein the multiplexer comprises an exclusive-OR gate having inputs respectively connected to an output of each of the plurality of ring oscillators.

23. The apparatus of claim 3, further comprising a frequency counter connected to an output of the multiplexer.

24. The apparatus of claim 23, further comprising a scan-out chain comprising flip-flops respectively connected to the frequency counter to output the number counted by the frequency counter.

25. The method of claim 9, comprising measuring a frequency of an output of the at least one daisy-chain output line to produce a measured frequency of an enabled ring oscillator, the measured frequency being representative of an integrated circuit chip parameter or group of parameters at a location of the enabled ring oscillator.

26. The method of claim 25, further comprising outputting the measured frequency as a digital output.

27. The integrated circuit chip of claim 13, wherein the plurality of ring oscillators comprise a shift register chain comprised of a plurality of shift registers, an output of each shift register being respectively connected to an enable/disable input of the gated inverter of one of the plurality of ring oscillators.

28. The integrated circuit chip of claim 15, wherein the multiplexer comprises an exclusive-OR gate having inputs respectively connected to an output of each of the plurality of ring oscillators.

29. The integrated circuit chip of claim 15, further comprising a frequency counter connected to an output of the multiplexer.

30. The integrated circuit chip of claim 29, further comprising a scan-out chain comprising flip-flops respectively connected to the frequency counter to output the number counted by the frequency counter.

31. The integrated circuit chip of claim 19, further comprising a scan-out chain comprising flip-flops respectively connected to the ripple counter to output the number counted by the ripple counter.

* * * * *